United States Patent [19]

Salick

[11] Patent Number: 4,672,610
[45] Date of Patent: Jun. 9, 1987

[54] BUILT IN SELF TEST INPUT GENERATOR FOR PROGRAMMABLE LOGIC ARRAYS

[75] Inventor: John E. Salick, Austin, Tex.

[73] Assignee: Motorola, Inc., Schaumburg, Ill.

[21] Appl. No.: 733,545

[22] Filed: May 13, 1985

[51] Int. Cl.[4] .............................................. G06F 11/00
[52] U.S. Cl. ...................................... 371/27; 371/21; 371/25
[58] Field of Search ...................... 371/27, 21, 20, 25, 371/26, 10, 23; 324/73 R

[56] References Cited

U.S. PATENT DOCUMENTS

| 4,380,811 | 4/1983 | Gotze | 371/20 |
| 4,517,672 | 5/1985 | Pfeiderer et al. | 371/27 |
| 4,525,714 | 6/1985 | Still et al. | 340/825.83 |
| 4,571,724 | 2/1986 | Belmondo | 371/25 |

OTHER PUBLICATIONS

S. Bozorgui-Nesbat, et al. "Lower Overhead Design for Testability of Programmable Logic Arrays," *IEEE 1984 International Design Test Conference*, (publication of papers) pp. 856-865.

H. Fujiwara, et al. "A Low Overhead, High Coverage, Built-in, Self-Test PLA Design," VLSI Design Laboratory, Dept. of Electrical Engineering, McGill University, Report No. 84.13, 1984.

R. Truer, et al. "An Implementation of a New, Built-in, Self-Test PLA Design," VLSI Design Laboratory, Dept. of Electrical Engineering, McGill University, Report No. 84.14, 1984.

*Primary Examiner*—Michael R. Fleming
*Attorney, Agent, or Firm*—John A. Fisher; Jeffrey Van Myers; David L. Mossman

[57] ABSTRACT

A built in self test input generator (BISTIG) for programmable logic arrays (PLAs) providing exhaustive fault coverage, but requiring additional space of only 8 to 15% of the PLA area. The BISTIG contains a test vector generator and a product term control, each of which has a sequence generator and associated decoder. The sequence generators generate $\log_2(N)$ and $\log_2(M)$ test vectors for the test vector generator and the product term control respectively, where N is the number of inputs to the PLA and M is the number of product terms connecting the first level of the PLA with the second level of the PLA.

6 Claims, 5 Drawing Figures

BUILT IN SELF TEST INPUT GENERATOR FOR PROGRAMMABLE LOGIC ARRAYS

FIELD OF THE INVENTION

The invention relates to apparatus and techniques for testing programmable logic arrays (PLAs) and more particularly relates to apparatus and methods for testing embedded PLAs using a built in self test input generator.

BACKGROUND OF THE INVENTION

Programmable logic arrays (PLAs) have become a popular element in the implementation of high density, functionally complex very large scale integrated (VLSI) circuits. It is expected that the use of PLAs in future IC designs will be even more pervasive. There are two basic reasons for the popularity and widespread use of PLAs. First, PLAs are simple in design and regular in structure, which reduces the complexity of the overall chip design. In addition, this regularity and simplicity lends itself to automation of the design process. Second, many attempts have been made to further reduce the hardware and silicon area required to implement a PLA design.

Despite the regularity of the structure and the simplicity of the design, in general, the testing of PLAs remains a difficult task. Test pattern generation for PLAs is a laborious and involved process. Even with a powerful test pattern generator program and under some modest fault assumptions (i.e., single stuck-at or bridging faults) complete fault coverage cannot be guaranteed.

Before an explanation of the problems inherent in testing PLAs is given, it may be useful to define some terms by reference to FIG. 1 of the drawings which shows a schematic of a prior art PLA 10. A programmable logic array 10 may be considered to be a two level NOR-NOR matrix of gates preceded by a one-bit decoder on each input. The PLA 10 shown in the Figures is a NOR-NOR PLA, but may be viewed as an effective AND-OR PLA. To simplify the notation, the first level of NOR gates will be referred to as a first level array 12. As mentioned, in one form, the first level array 12 may be connected to form a set of AND gates 14. Likewise, the second level array 16 may be connected to form a set of OR gates 18. However, PLA 10 may be easily modified to implement one of the other three styles of PLA, AND-OR, OR-AND, and NAND-NAND.

In general, the first level array 12 has N input lines 20, $X_1$-$X_N$, for receiving N normal input signals, and M output lines, $Y_1$-$Y_M$, 22 for providing M product terms. The second level array 16 has M input lines 22 for receiving the M product terms and P output lines 24, $Z_1$-$Z_P$, for providing P output signals. The term n will be used to refer to the number of inputs to any particular gate in the first level of the PLA, whereas m will be used to refer to the number of outputs that any particular gate feeds. Subscripts k and L will be used to refer to any general AND or OR gate, respectively.

Under the single stuck fault assumption, a single n-input gate has $2(n+1)$ potential faults, including a stuck high fault and a stuck low fault on the output and on each input. All of these faults can be detected by $n+1$ tests. For the entire PLA, the total number of tests required will be designated as M(2N) tests. For a NOR gate, all inputs set to ZERO (the non-controlling value, i.e. one which will not finally cause a change in output) stimulates the stuck high fault on the inputs and the stuck low fault on the output. This is called the exact decode test. Individually setting each one of the inputs high while holding all others low stimulates the stuck low fault on the input under test and the stuck high fault on the output.

To detect a fault in PLA 10, it must be stimulated by an appropriate input test vector and propagated to one of the P outputs 24. To sensitize a path from a particular $AND_k$ through $OR_L$ to its output, we must set all of the other m-1 inputs to $OR_L$ to their non-controlling value. Since the N inputs fan out into various product terms 22 which recombine as inputs to the OR plane 16, this test problem is non-trivial. In fact, algorithmically it is non-polynomially or np complete, meaning that the test problem is not solvable by polynomial techniques and must be solved by exhaustively applying all possible permutations of test vectors.

In general, the test problem requires a judicious setting of the "don't cares" in an input test vector in order to propagate the fault. It is often not possible to propagate an AND fault through every OR gate it feeds. Thus, the path to sensitize becomes an additional variable. For a non-embedded PLA this is merely a computationally intense problem. However, when the inputs to the PLA are embedded, the problem is much more complex. A PLA 10 is "embedded" in a circuit when other circuitry is interposed between the inputs 20 to the PLA 10 and the input paths available for external stimulation. Typically, the vectors applied to the external inputs will not be the same as the required PLA inputs since the external signals must be propagated through—and changed by—the intervening logic. If this logic is sequential, it may be necessary to apply several external inputs to produce one test vector.

Embedded PLAs will also typically have a reduced universe of input vectors. This reduction is a function of the intervening logic and is typically far from obvious. Reducing the universe virtually rules out computer automated test pattern generation (ATPG), as many of the ATPG vectors will be impossible to produce at the embedded PLA inputs. Furthermore, some faults may be impossible to detect by any test in this reduced universe.

One method of dealing with the problem of reconvergent fan-out is to insert additional control points on the product terms 22. In this technique, all product terms 22 except for the output of the AND gate 14 under test are pulled low. This sensitizes a path to all outputs fed by this AND gate 14.

Several authors have proposed using an M-bit shift register for Product Term Control (PTC). If the shift register (SR) is connected to the PLA such that a ONE in a SR bit disables its associated product term 22, then walking a ZERO through a field of ONEs in the SR will enable each product term 22, one at a time. Unfortunately, the area required for a SR of this type is prohibitive for large volume VLSI production.

An alternative proposal is the decoder depicted in FIG. 1 and described by S. Bozorgui-Nesbat, et al. in "Lower Overhead Design for Testability of Programmable Logic Arrays," *IEEE 1984 International Test Conference* (publication of papers), pp. 856–865. Here, $\log_2(M)$ additional inputs 28 are applied to a one-of-M decoder 26. The outputs of this decoder 26 are used exactly as the SR outputs were previously used. Applying the proper sequence of vectors to the additional inputs 28 will walk a ZERO through a field of ONEs on the decoder 26 outputs 22. However, this requires additional paths to be routed to the PLA 10 and additional pins for these inputs, causing a potentially large area overhead. Even the authors of the cited article admit that this method would not be suitable for built in self test (BIST) techniques.

Neither of these two methods are BIST. Both pay an area penalty merely to simplify test pattern generation. The test pattern simply consists of all the n+1 tests for each AND gate 14. Propagating these tests from the input pins to an embedded PLA may be difficult or impossible.

Recently, a PLA test method has been suggested which uses a shift register on the PLA inputs and a second shift register on the product terms by R. Truer, et al. in "Name and Implementation of a New Built in Self Test PLA Design," *Design and Test, Report No. 84.14* from McGill VLSI Design Laboratory, 1984. This test apparatus, although on the chip, is slow in its test routine. In addition, a conventional program term control register is still used in this design, which yet occupies a large amount of chip area.

For an integrated circuit, the simplest on-chip test vector generator is a linear feedback shift register (LFSR). By generating $2^N-1$ vectors (the all ZERO case will not occur), this approach nearly exhaustively tests the PLA. The LFSR requires no additional PTC logic. However, most of the $2^N-1$ vectors generated by the LFSR serve no useful purpose. Thus, although the area overhead is low, the time overhead is unacceptable for PLAs with many inputs.

Thus, there remains a need for a BIST for PLAs which is acceptable in terms of time and area overhead. This need is particularly strong in the case of embedded PLAs.

SUMMARY OF THE INVENTION

Accordingly, it is an object of the present invention to provide a BIST input generation apparatus for PLAs that requires only one extra external input path and additional area requirements of only 8 to 15% of the original PLA.

Another object of the present invention is to provide a BIST for PLAs that will cover all detectable stuck faults and bridging faults (shorts).

Still another object of the invention is to provide a BIST for input generation which can be run at the operating speed of the PLA and which may be run concurrently with other tests of the circuitry.

Yet another object of the present invention is to provide a BIST for input generation which does not need to be custom designed for a particular PLA.

Another object of the present invention is to accomplish the above mentioned objects for embedded PLAs.

In carrying out these and other objects of the invention, there is provided, in one form, a built in self test input generator (BISTIG) for a PLA, where the PLA comprises a first level array adapted to receive N input signals on N input lines and to provide M product terms on M product term lines, and a second level array adapted to receive the M product terms on the M product term lines and to provide P output signals on P output lines, wherein N, M and P are integers greater than one. The BISTIG has a test vector generator (TVG), responsive to a test signal, for providing N test vectors on the N input lines of the first level array of the PLA, the TVG comprising a $\log_2(N)$ sequence generator and a one-of-N decoder. The BISTIG also has a product term control (PTC), responsive to said test signal, for enabling each M product term line of the second level array of the PLA individually, where the PTC has a $\log_2(M)$ sequence generator and one-of-M decoder.

DETAILED DESCRIPTION OF THE INVENTION

Figure 1:
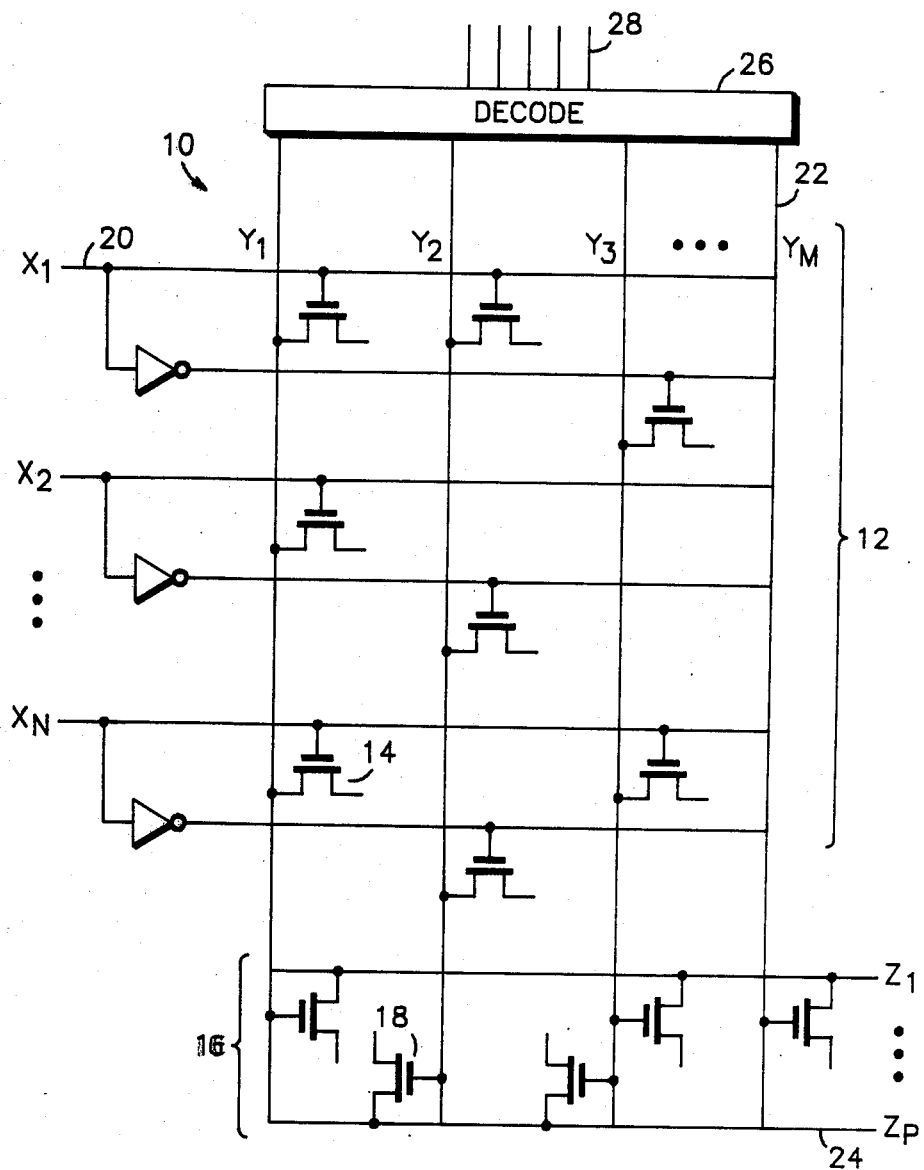
FIG. 1 is a schematic diagram of a prior art apparatus for testing a PLA.

Shown in FIG. 1 is a prior art apparatus for testing a PLA 10. As discussed above, the apparatus is simply a decoder 26 that is tied into the product terms 22 of the first level array 12. The M inputs to the product terms 22 are controlled by decoder 26 via multiple input lines 28 connected to external input paths. It is these input lines 28 that cause the large extra area overhead when this apparatus is used to test an embedded PLA.

Figure 2A:
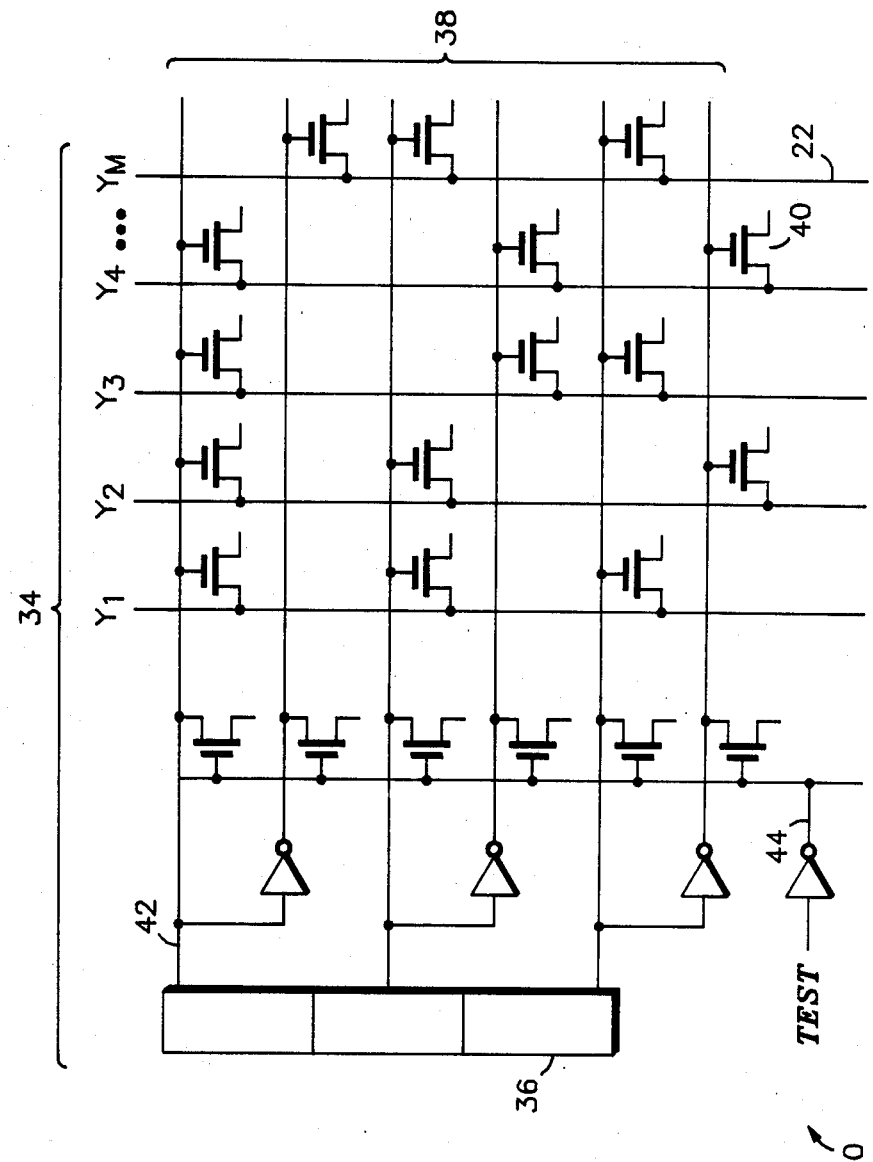
FIG. 2A is a schematic diagram of the product term control of the built in self test apparatus of this invention connected to a PLA to be tested.
Figure 2B:
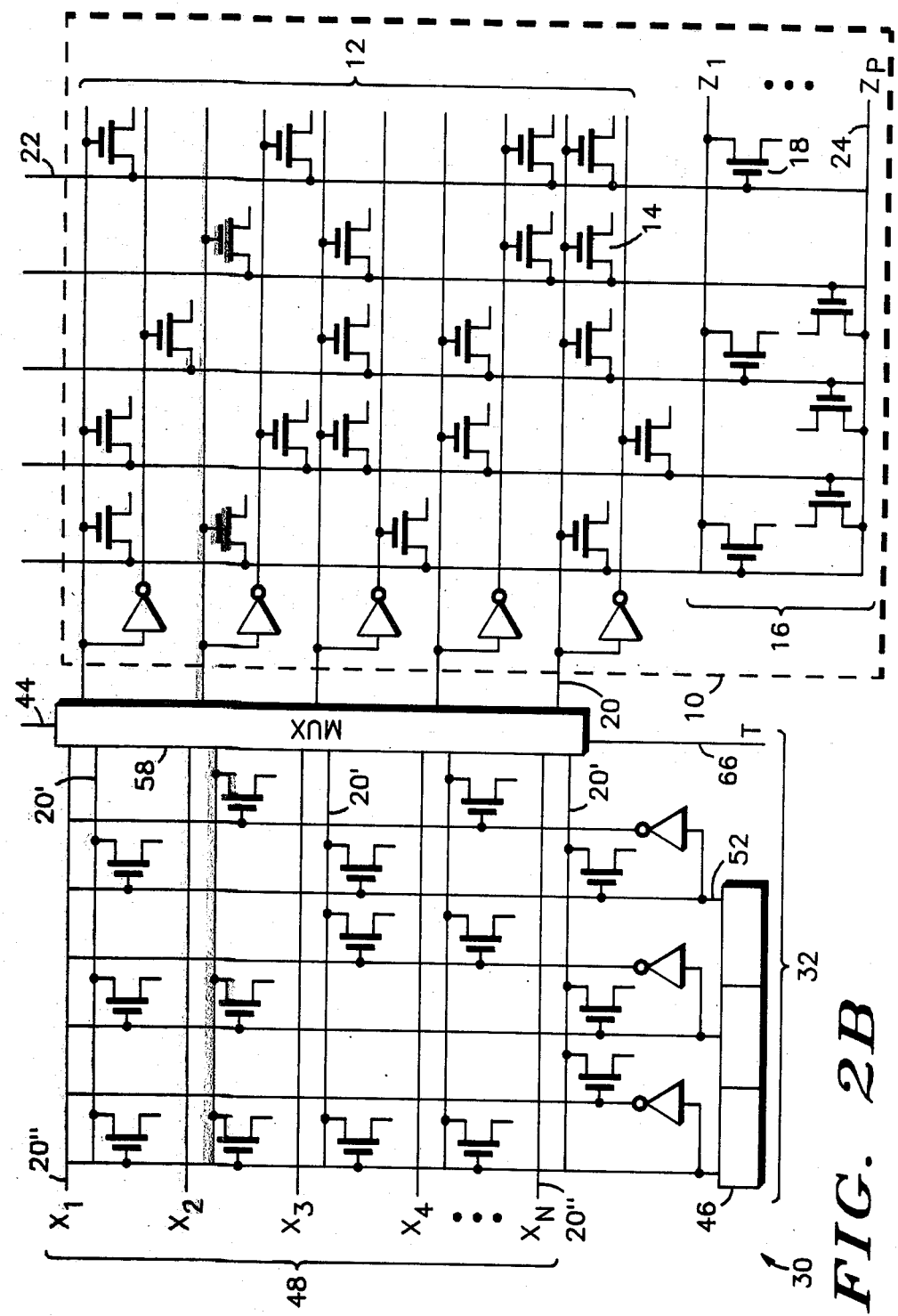
FIG. 2B is a schematic diagram showing the test vector generator of the built in self test apparatus of this invention connected to a PLA to be tested.

Shown in FIGS. 2A and 2B is a detailed schematic diagram of the appartus of the present invention. PLA 10 is shown to have a first level array or AND plane 12 containing a plurality of AND gates 14 at the intersection of N input lines 20 and M product terms 22, as well a second level array or OR plane 16 composed of a plurality of OR gates 18 at the intersections of the product terms 22 and the P output lines 24. The precise way in which the PLA 10 is programmed or interconnected, sometimes called its functionality or personality, is immaterial to the apparatus and method of the invention. The present invention need not be adapted to the functionality of a particular PLA 10, although the invention does have to match the size of the particular PLA 10.

The BISTIG 30 of the present invention has three primary parts, namely a test vector generator (TVG) 32 shown in FIG. 2B, a product term control (PTC) 34 shown in FIG. 2A and miscellaneous control logic. While these circuits do not depend on the personality or functionality of the PLA 10, they do depend on the size of the PLA, specifically on N and M. In general, the PTC 34 partitions first level array 12 of PLA 10 so that only one product term is transmitted to the second level array 16. The TVG 32, in turn, provides the N tests to exercise the AND gates 14 and all OR gates 18 to which they may be connected.

The TVG 32 of FIG. 2B comprises a sequence generator 46 which provides $\log_2(N)$ outputs along lines 52 to a one-out-of-N decoder 48 which drives a set of N test input lines 20'. Of course, the term $\log_2(N)$ as used herein refers to an integer value at least as great as the actual number $\log_2(N)$, and likewise for $\log_2(M)$.

In response to a TEST signal on a signal path 44, a multiplexer or MUX 58 couples the N test input lines 20' to the respective N normal input lines 2" of the first level array 12 of PLA 10 instead of the normal input lines 20″. In this form, the sequence generator 46 provides a series of input vectors consisting of a ONE walking through a field of ZEROS (enabling one input while pulling the others low).

The PTC 34 shown in FIG. 2A comprises another sequence generator 36 which provides $\log_2(M)$ outputs and a one-out-of-M decoder 38 which selectively enables the M product terms 22. As the $\log_2(M)$ sequence generator 36 cycles through its states, each product term 22 is enabled in turn, while all others are disabled. When not in the test mode, the $\log_2(M)$ sequence generator 36 outputs 42 are pulled down by test line 44 to disable the PTC 34 circuitry.

Figure 3:
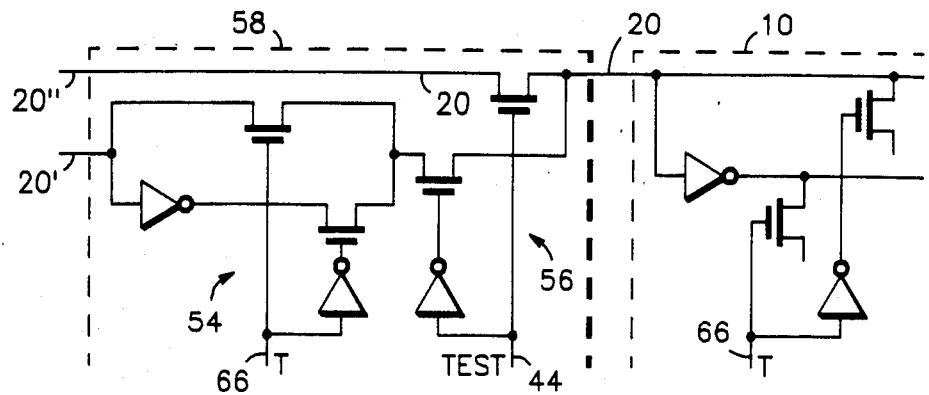
FIG. 3 is a detailed schematic diagram of the multiplexers used in the input lines of the test vector generator of the present invention.

In the preferred form shown in FIG. 3, MUX 58 includes a true/complement MUX 54 and a normal/test MUX 56 which together select the N input signals to be input to the N input lines 20 of PLA 10. The true/complement MUX 54 selects either the true or complement forms of the N test signals on the N test input lines 20′. The normal/test MUX 56 selects either the normal N input lines 20″ or the N test input lines 20′.

A T signal on a signal path 66 controls the true/complement MUX 54. In the preferred form, the T signal also controls the inputs to PLA 10. When T 66 is asserted, the N test inputs 20′ consisting of one ONE in a field of N-1 ZEROS are applied directly to the N input lines 20 of first level array 12 by MUX 58. Since these test inputs will be complemented by the input decoders of PLA 10, T 66 is used to pull down all complement lines. On the other hand, when T is negated, MUX 58 complements the N test inputs to provide one ZERO in a field of ONEs. For this test, T* pulls down all true lines of the input decoders of PLA 10.

Figure 4:
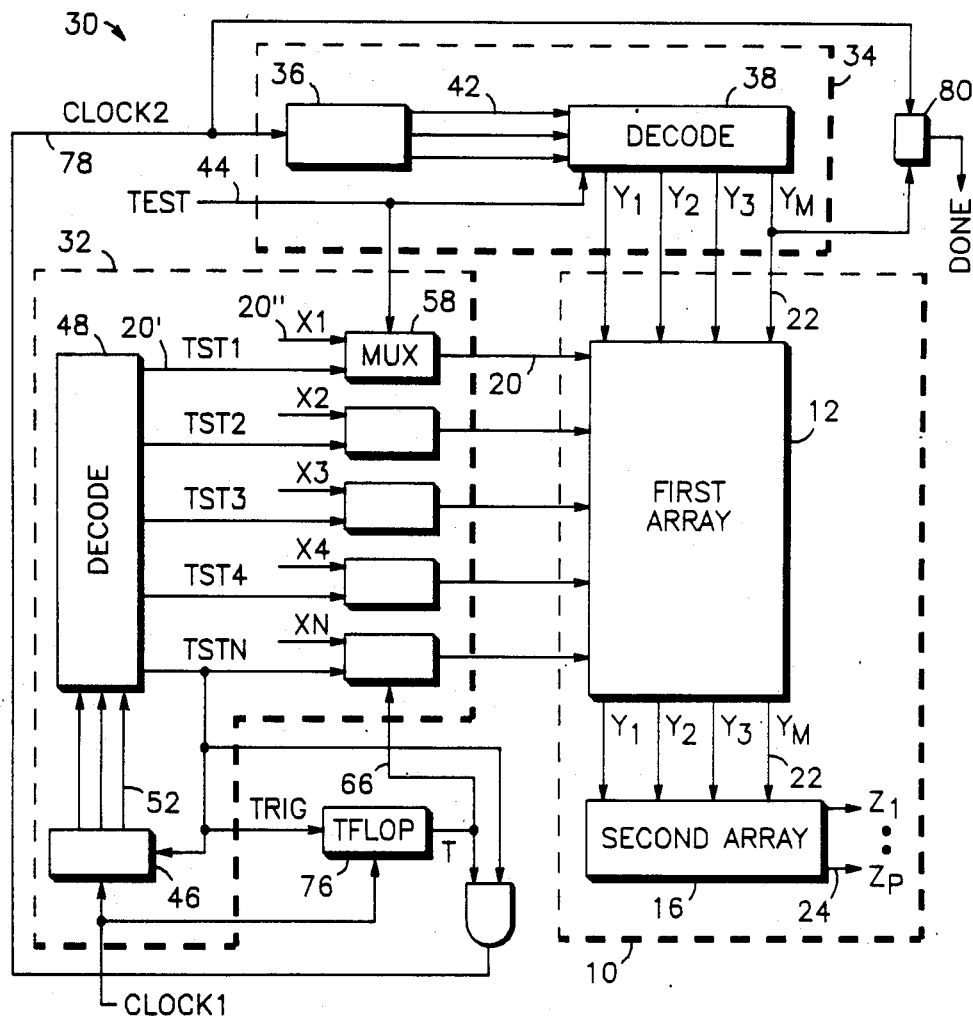
FIG. 4 is an overall schematic diagram of the BISTIG of this invention wired to a PLA to be tested.

Shown in FIG. 4 is an overall schematic diagram of the preferred form of BISTIG 30, together with a PLA 10 under test. In operation, BISTIG 30 tests PLA 10 by walking a ONE through a field of ZEROS on the true input lines and then walking a ONE through a field of ZEROS on the complement input lines for each product term. Thus, in this manner, an exhaustive testing of PLA 10 may be performed.

Asserting the last TVG 32 line 20′ generates a signal, TRIG, on the next CLOCK1 cycle. A trigger flip-flop TFLOP 76 changes state when TRIG is asserted. Flip-flop 76 drives T and its complement T*. Alternately, T may be driven by its own input line. TRIG also resets TVG 32 sequence generator 46, and gates the PTC clock (CLOCK2 78). DONE is generated by the PTC 34 circuit in a manner analogous to LAST. DONE is generated through DONE flip flop 80 after the last product term $Y_M$ is enabled and the test vector generation sequence is over.

The BISTIG 30 apparatus described thus provides a technique for guaranteed fault coverage of all detectable stuck faults and bridging faults. Yet BISTIG 30 only requires on the order of 8 to 15% of the size of the original PLA 10. For comparison, the BIST of the Truer article, described above, while occupying comparable silicon area for the TVG equivalent, would require from about two to three times as much area for its PTC equivalent, based on the well accepted lambda VLSI layout parameter. The Truer BIST device is believed to be the closest one to the present invention even though its test vector input generation is slower and it occupies much more chip area.

In addition in the inventive test generator, no off-chip test generation is required, by test computer or operator. Testing of the PLA 10 may thus be run at operating speed and may be run concurrently with other tests. It should also be remembered that the BISTIG 30 does not have to be custom tailored for a particular PLA 10, other than sizing it for the PLA 10.

In an optional version of the invention, sequence generators 36 and 46 are both linear feedback shift registers (LFSRs) which are known to function as pseudo random number generators.

It should be noted that the invention does not cover the decoding and comparisons that would be seen at the P output lines 24. Reading the results and comparisons with the theoretical results can be conducted with any apparatus and by any method well known in the art.

I claim:

1. A built in self test input generator (BISTIG) for a programmable logic array (PLA), wherein the PLA comprises a first level array adapted to receive N input signals in N input lines and to provide M product terms on M product term lines, and a second level array adapted to receive the M product terms on the M product term lines and to provide P output signals on P output lines, wherein N, M, and P are integers greater than one, the BISTIG comprising:

a test vector generator comprising:
　a test signal input line originating from a test computer;
　a $\log_2(N)$ sequence generator for providing $\log_2(N)$ outputs along a plurality of lines to
　a one-of-N decoder which, in response to the outputs from the $\log_2(N)$ sequence generator, drives a set of N test input lines which the test vector generator couples to the N input lines of the PLA;
　wherein the test vector generator responds to a test signal on the test signal input line, by providing N test vectors on the N input lines of the first level array of the PLA; and a product term control comprising:
　a test signal input line originating from a test computer;
　a $\log_2(M)$ sequence generator for providing $\log_2(M)$ outputs along a plurality of lines to
　a one-of-M decoder which, in response to the outputs from the $\log_2(M)$ sequence generator, selectively enables the M product term lines of the second PLA individually;
　wherein the product term control responds to a test signal on the test signal input line.

2. The BISTIG of claim 1 wherein the test vector generator further comprises means for selectively complementing the test vectors consisting of multiplexing means accepting input from the N test lines of the one-of-N decoder and providing output to the N input lines of the first level array of the PLA, wherein the multiplexing means is for selecting between the true or complement of the generated tests and for choosing between normal and test inputs.

3. The BISTIG of claim 2 wherein the multiplexing means selects between the true or the complement of said test vectors in response to a T signal on a T signal input line to the multiplexing means.

4. The BISTIG of claim 3 wherein the BISTIG includes a trigger flip-flop for providing the T signal to the multiplexing means on the T signal input line, for resetting the sequence generator of the test vector generator and for sequencing the sequence generator of the product term control in response to a clock of the PLA and in response to a last test vector generated out of the one-of-N decoder.

5. The BISTIG of claim 1 wherein the $\log_2(N)$ and $\log_2(M)$ sequence generators are linear feedback shift registers.

6. A built in self test input generator (BISTIG) for a programmable logic array (PLA), wherein the PLA comprises a first level array adapted to receive 2N input signals on N input lines and to provide M product terms on M product term lines, and a second level array adapted to receive the M product terms on the M product term lines and to provide P output signals on P output lines, wherein N, M and P are integers greater than one, the BISTIG comprising:

a test vector generator comprising:
  a test signal input line originating from a test computer;
  a $\log_2(N)$ linear feedback shift register for providing $\log_2(N)$ outputs along a plurality of lines to
  a one-of-N decoder which, in response to the outputs from the $\log_2(N)$ sequence generator, drives a set of N test input lines which the test vector generator couples to the N input lines of the PLA; and
  multiplexing means accepting input from the N test lines of the one-of-N decoder and providing output to the N input lines of the first level array of the PLA, wherein the multiplexing means is for selecting between the true or complement of the generated tests and for choosing between normal and test inputs;
  wherein the test vector generator responds to a test signal on the test signal input line, by providing N test vectors on the N input lines of the first level array of the PLA; and a product term control comprising:
  a test signal input line originating from a test computer;
  a $\log_2(M)$ linear feedback shift register for providing $\log_2(M)$ outputs along a plurality of lines to
  a one-of-M decoder which, in response to the outputs from the $\log_2(M)$ sequence generator, selectively enables the M product term lines of the second PLA individually;
  wherein the product term control responds to the test signal on the test signal input line.

* * * * *